US008734660B2

(12) United States Patent
Ma et al.

(10) Patent No.: US 8,734,660 B2
(45) Date of Patent: May 27, 2014

(54) ADVANCED MASK PATTERNING WITH PATTERNING LAYER

(75) Inventors: Jian Ma, San Jose, CA (US); Phil Freiberger, Santa Clara, CA (US); Karmen Yung, Sunnyvale, CA (US); Frederick Chen, Cupertino, CA (US); Chaoyang Li, San Jose, CA (US); Steve Mak, Pleasanton, CA (US)

(73) Assignee: Intel Corporation, Santa Clara, CA (US)

( * ) Notice: Subject to any disclaimer, the term of this patent is extended or adjusted under 35 U.S.C. 154(b) by 1147 days.

(21) Appl. No.: 12/194,689

(22) Filed: Aug. 20, 2008

(65) Prior Publication Data

US 2008/0308527 A1 Dec. 18, 2008

Related U.S. Application Data

(62) Division of application No. 11/092,993, filed on Mar. 28, 2005, now Pat. No. 7,460,209.

(51) Int. Cl.
*B44C 1/22* (2006.01)
*B32B 7/02* (2006.01)
*H01L 21/461* (2006.01)

(52) U.S. Cl.
CPC ... *B44C 1/22* (2013.01); *B32B 7/02* (2013.01); *H01L 21/461* (2013.01)
USPC .............................................. 216/47; 438/743

(58) Field of Classification Search
CPC ............ B44C 1/22; B32B 7/02; H01L 21/461
USPC .............................................. 216/47; 438/743
See application file for complete search history.

(56) References Cited

U.S. PATENT DOCUMENTS

| 5,716,758 | A | 2/1998 | Bae et al. ........................ 430/312 |
| 6,020,269 | A | 2/2000 | Wang et al. .................... 438/717 |
| 6,120,641 | A | 9/2000 | Stevens et al. | |
| 6,184,151 | B1 * | 2/2001 | Adair et al. .................... 438/743 |
| 6,656,644 | B2 | 12/2003 | Hasegawa et al. ................ 430/5 |
| 6,811,959 | B2 * | 11/2004 | Magg ............................. 430/322 |
| 6,916,582 | B2 | 7/2005 | Yoshizawa et al. ................ 430/5 |
| 7,005,216 | B2 | 2/2006 | Shiraishi et al. .................. 430/5 |
| 7,037,626 | B2 | 5/2006 | Dirksen et al. .................... 430/5 |

OTHER PUBLICATIONS

S. Wolf and R.N. Tauber, (Silicon Processing for the VLSI Era, vol. 1—Process Technology, Lattice Press, 1986, pp. 520-526).*

* cited by examiner

*Primary Examiner* — Nadine Norton
*Assistant Examiner* — Mahmoud Dahimene
(74) *Attorney, Agent, or Firm* — Blakely, Sokoloff, Taylor & Zafman LLP

(57) ABSTRACT

An imaging structure such as a mask or reticle may be fabricated using a patterning layer on an imaging layer. The patterning layer may have substantially different etch properties than the imaging layer. A first etch process may be selective of the patterning layer with respect to a resist layer. A second etch process may be selective of the imaging layer with respect to the patterning layer.

6 Claims, 3 Drawing Sheets

ADVANCED MASK PATTERNING WITH PATTERNING LAYER

RELATED APPLICATIONS

This application is a divisional application and claims priority to U.S. application Ser. No. 11/092,993, filed on Mar. 28, 2005, the contents of which are incorporated herein in their entirety.

BACKGROUND

Integrated circuits are formed by patterning successive layers on a substrate such as a silicon wafer. Patterns are transferred to the substrate using lithography.

FIG. 1 illustrates an exemplary lithography process. Light 105 is incident on a mask 110. Mask 110 includes a chrome layer 112 and a quartz layer 114, where a pattern of the chrome layer 112 is configured to transfer the desired pattern to the surface of a substrate 120 by interacting with a photoresist layer 122 on the surface.

Light 106 incident on chrome layer 112 is substantially reflected and/or absorbed by chrome layer 112. Light 107 incident on quartz layer 114 is substantially transmitted to the surface of a substrate 120.

The transmitted light interacts with photoresist layer 122, and changes the properties of the photoresist. For example, the light may break bonds in the photoresist so that illuminated portions may later be removed, or form bonds in the photoresist so that illuminated portions will not be removed. Substrate 120 with photoresist layer 122 may then be processed further to "develop" the pattern on the surface.

A similar process is used to form mask 110. For example, a photoresist layer is formed on an unprocessed chrome layer, and lithography is used to pattern the chrome layer with the desired features.

BRIEF DESCRIPTION OF THE DRAWINGS

Like reference symbols in the various drawings indicate like elements.

DETAILED DESCRIPTION

Figure 1:
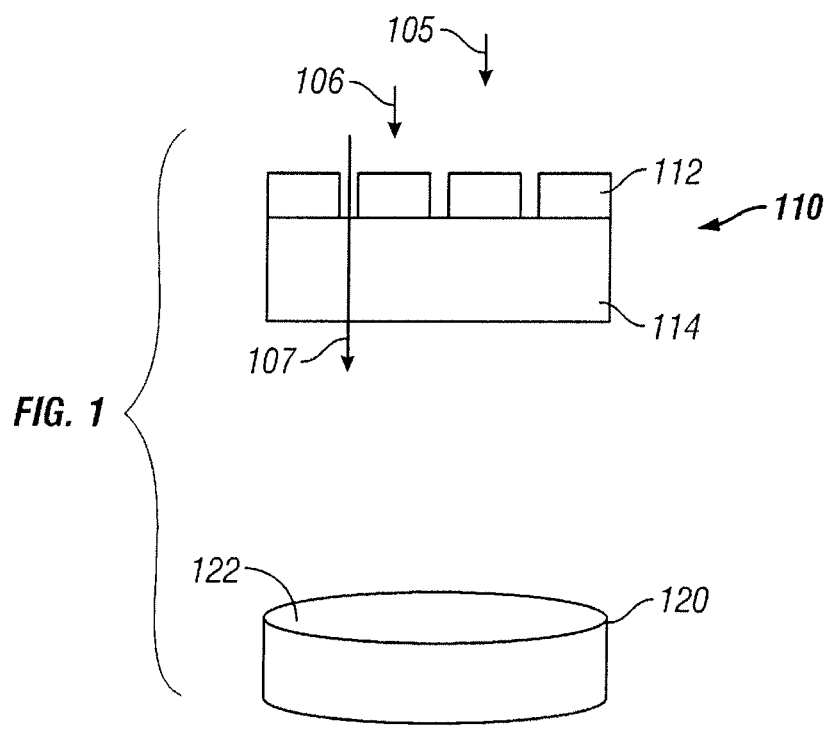
FIG. 1 shows a side view of an exemplary lithography process.
Figure 2A:
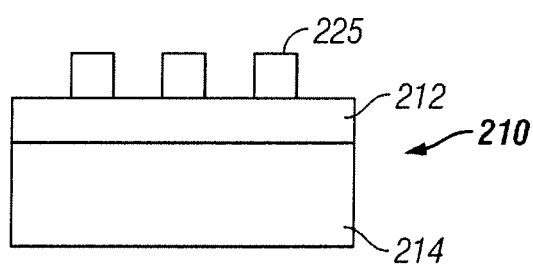
FIG. 2A shows a cross-sectional side view of an exemplary mask structure prior to an etch process.

As noted above, imaging structures such as masks or reticles are used to pattern features on substrates. FIG. 2A shows a cross sectional view of a mask 210 with photoresist features 225 on a chrome layer 212 to be patterned. An etch process is used to transfer the photoresist pattern to chrome layer 212.

In some circumstances, the etch process used to pattern the chrome may not be sufficiently selective of chrome. For example, the etch process may significantly etch photoresist while the chrome layer is being etched. Selectivity is defined as the etch rate of one material with respect to a different material. For some current etch processes, the selectivity is about 1:1; that is, chrome and photoresist are etched at approximately equal rates.

Figure 2B:
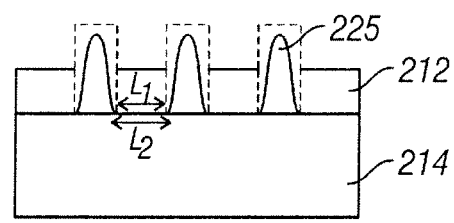
FIG. 2B shows a cross-sectional side view of an exemplary mask structure after an etch process.

FIG. 2B illustrates this phenomenon. The dashed lines indicate the original photoresist structures 225, and the projected pattern in chrome layer 212 based on structures 225, which has a line width $L_1$ as shown. However, if the etch process also etches structures 225, the pattern transferred to chrome layer 212 is different than the planned pattern.

In FIG. 2B, etching of structures 225 is shown. The solid lines show an example of the resulting chrome layer 212, which has a line width $L_2$. Depending on the properties of the etch and of structures 225, the difference between $L_1$ and $L_2$ may be significant. Chrome layer 212 may exhibit other undesired characteristics. As shown in FIG. 2B, the sidewalls of the remaining chrome layer 212 may be angled rather than straight. The remaining chrome layer 212 may also exhibit footing at the interface with the substrate 214.

Figure 3:
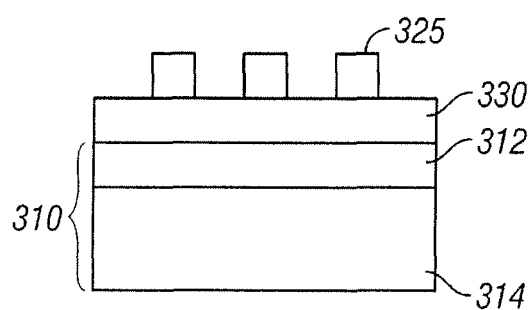
FIG. 3 shows a side view of an implementation of a mask structure prior to an etch process.

FIG. 3 shows a side view of an implementation of a mask 310 which may provide for more accurate transfer of the pattern to a chrome layer. Mask 310 includes a chrome layer 312 on a quartz layer 314. Mask 310 further includes a patterning layer 330 on chrome layer 312.

Patterning layer 330 includes a patterning material that is, for a first etch process, more easily etched than photoresist. For a second etch process, the patterning material is less easily etched than chrome.

For example, the first etch process may have a selectivity of patterning material to photoresist of greater than 10:1 (for example, about 20:1). Similarly, the second etch process may have a selectivity of chrome to patterning material of greater than 10:1 (for example, about 20:1). Note that these values are exemplary; for smaller features, larger selectivities may be needed, while for larger features, less selective etch processes may be used. The aspect ratio of features being patterned also affects the selectivities that may be used.

Figure 4:
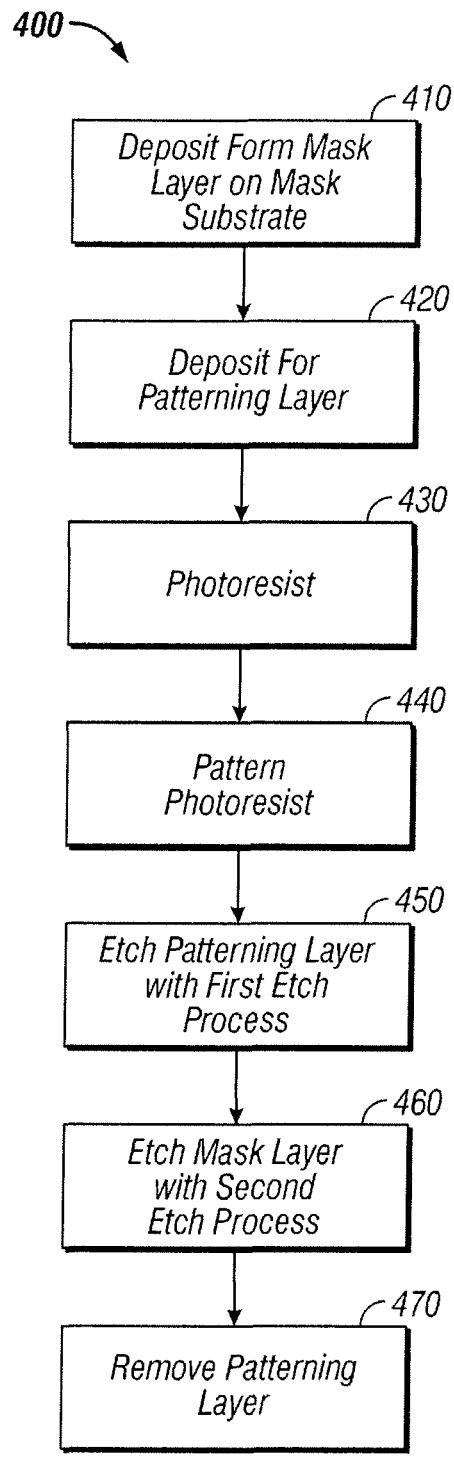
FIG. 4 shows a method that may be used to fabricate a mask according to some implementations.

FIG. 4 shows a method 400 that may be used to pattern a mask, reticle, or other imaging structure using a patterning layer such as layer 330 of FIG. 3. At 410, a mask layer is formed on a mask substrate. For example, a chrome layer may be formed on a quartz substrate.

At 420, a patterning layer such as layer 300 of FIG. 3 is formed on the mask layer. As noted above, the material for the patterning layer has different etch characteristics than photoresist and than the mask layer. For example, the material may comprise an oxide such as silicon dioxide, which may be deposited using a chemical vapor deposition (CVD) process. Other materials may be used, including nitrides such as $Si_3N_4$, Si, and/or other appropriate materials.

At 430, photoresist is deposited on the patterning layer, and at 440 features to be transferred to the mask are formed in the photoresist.

At 450, the patterning layer is etched using a first etch process that is selective of the patterning layer with respect to photoresist. That is, the first etch process etches the material of the patterning layer much more effectively than it etches photoresist. For example, when the patterning layer comprises silicon dioxide, the first etch process etches silicon dioxide at a much higher rate than it etches photoresist. As a result, the photoresist features are not significantly degraded, and the pattern in the photoresist is more accurately transferred to the patterning layer. One example of a first etch process that may be used is a $CHF_3$ and $O_2$ etch. An exemplary etch rate is about 0.8 Angstroms per second, with a 100% overetch rate.

At 460, the mask layer is etched using a second etch process. The second etch process is selective of the mask layer with respect to the patterning layer. For example, where the mask layer is a chrome layer, and the patterning layer comprises silicon dioxide, the second etch etches chrome at a much higher rate than it etches silicon dioxide. As above, this results in a more accurate pattern transfer to the mask layer. An example of the second etch process is a standard chromium etch process.

At 470, the patterning layer may be removed. However, in some implementations, the patterning layer is not removed. Instead, the patterning layer may be a material with optical properties that allow at least some thickness of the patterning layer to remain on the mask. For example, the patterning layer may include an oxide such as silicon dioxide that does not substantially affect the optical properties of the resulting mask at the thicknesses used for mask fabrication.

Figure 5:
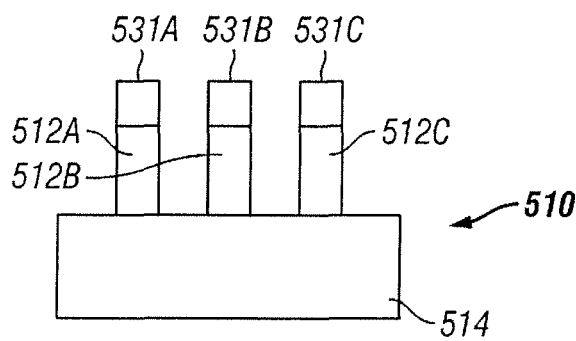
FIG. 5 shows a cross-sectional side view of a mask fabricated according to some implementations.

FIG. 5 shows an implementation of a mask 510, where the patterning layer is not removed subsequent to patterning the chrome layer. Substrate layer 514, which may be a quartz substrate, generally transmits light of a wavelength used to perform lithography (for example, 193 nm, 248 nm, or other lithography wavelength). Portions 512A, 512B, and 512C of a mask layer (e.g., chrome), generally do not transmit light having the lithography wavelength.

Portions 531A, 531B, and 531C of the patterning layer used to fabricate mask 510 remain on the mask. The material used for the patterning layer, and the thickness of the patterning layer may have been selected so that the optical properties of mask 510 are not unduly affected. Note that the thicknesses of portions 531 and 512 shown in FIG. 5 are for illustration.

For example, the patterning layer may be fabricated from a material including an oxide such as silicon dioxide. The thickness of the patterning layer may range from about 2 nm to about 25 nm, depending on the etch and optical properties of the material. For silicon dioxide, a range from about 5 nm to about 15 nm (e.g., about 10 nm) may provide both improved pattern transfer and substantially similar optical properties when the patterning layer remains on the mask.

Figure 6:
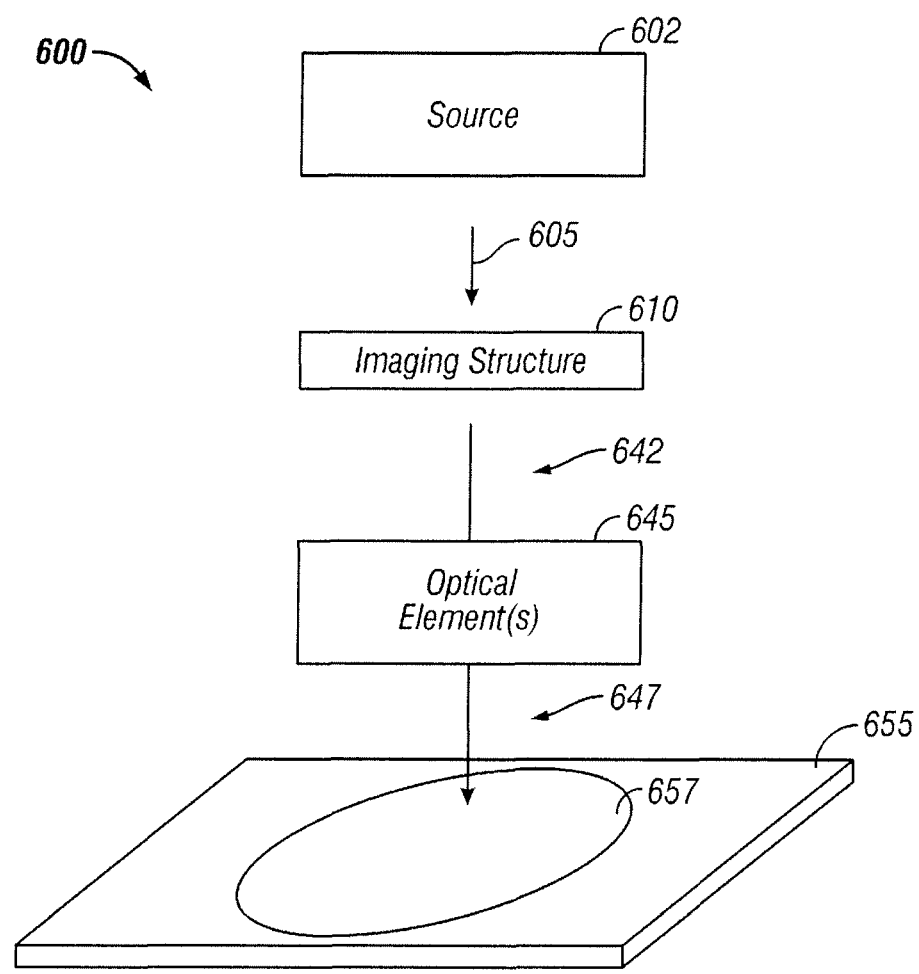
FIG. 6 shows an implementation of a lithography system including an exemplary mask structure.

An imaging structure (e.g., mask or reticle) may be incorporated in a lithography system such as system 600 of FIG. 6. A light source 602 may provide imaging light 605 including light of an imaging wavelength.

An imaging structure 610 is positioned to receiving the imaging light and to modify the light to pattern structures on a substrate 657. Light 642 from imaging structure 610 may be incident on one or more optical elements 645 (e.g., lenses). Light 647 from optical elements 645 may in turn be incident on a substrate 657 positioned in substrate holder 655.

A lithography system incorporating an imaging structure such as that shown and described above may more accurately pattern features on substrate 657. For example, the features fabricated on a mask such as mask 510 of FIG. 5 may more accurately reflect the design intent than a mask fabricated using available mask fabrication techniques.

A number of implementations have been described. Although only a few implementations have been disclosed in detail above, other modifications are possible, and this disclosure is intended to cover all such modifications, and most particularly, any modification which might be predictable to a person having ordinary skill in the art. For example, although much of the description above primarily uses the term "mask," the systems and techniques also apply to reticles or other imaging structures. Different materials may be used; for example, silicon nitride may be used in the patterning layer rather than or in addition to silicon dioxide. Additionally, different types of patterning and lithography than discussed herein may be used. For example, both negative and positive resists may be used, bright or dark field lithography may be used, and the like.

Also, only those claims which use the words "means for" are intended to be interpreted under 35 USC 112, sixth paragraph. Moreover, no limitations from the specification are intended to be read into any claims, unless those limitations are expressly included in the claims. Accordingly, other embodiments are within the scope of the following claims.

What is claimed is:

1. A method of fabricating an imaging structure, comprising:
   providing a structure, the structure comprising:
      a substrate layer with transparent to an imaging wavelength;
      an imaging layer on the substrate layer;
      the imaging layer opaque to the imaging wavelength and further having etch properties;
      a patterning layer on the imaging layer, wherein the patterning layer is silicon and has etch properties that are different from the etch properties of the imaging layer, and wherein a thickness of the patterning layer is in the range from two nanometers to twenty five nanometers; and
      a resist layer on the patterning layer;
   etching features in a patterning layer using a first etch process selective of the patterning layer with respect to the photoresist; and
   etching features in the imaging layer using a second different etch process selective of the imaging layer with respect to the patterning layer.

2. The method of claim 1, wherein providing the structure comprises:
   receiving the substrate layer;
   forming the imaging layer on the substrate layer;
   forming the patterning layer on the imaging layer; and
   forming the resist layer on the patterning layer.

3. The method of claim 1, further comprising pattering the photoresist layer.

4. The method of claim 1, wherein the first etch process has a selectively of the patterning layer with respect to the photoresist of 10:1 or greater.

5. The method of claim 1, wherein the second different etch process has a selectivity of the imaging layer with respect to the patterning layer of 10:1 or greater.

6. The method of claim 1, further comprising, subsequent to etching features in the imaging layer using a second different etch process selective of the imaging layer with respect to the patterning layer, removing the patterning layer.

* * * * *